(12) United States Patent
Helbig et al.

(10) Patent No.: US 8,186,849 B2
(45) Date of Patent: May 29, 2012

(54) LUMINOUS MODULE AND METHOD FOR PRODUCING IT

(75) Inventors: Peter Helbig, Sontheim an der Brenz (DE); Peter Frey, Heidenheim (DE); Ralf Vollmer, Ulm (DE)

(73) Assignee: OSRAM AG, Munich (DE)

( * ) Notice: Subject to any disclaimer, the term of this patent is extended or adjusted under 35 U.S.C. 154(b) by 689 days.

(21) Appl. No.: 12/230,470

(22) Filed: Aug. 29, 2008

(65) Prior Publication Data

US 2009/0067169 A1    Mar. 12, 2009

(30) Foreign Application Priority Data

Sep. 3, 2007   (DE) .......................... 10 2007 041 817

(51) Int. Cl.
  *F21V 33/00*   (2006.01)

(52) U.S. Cl. ............... 362/249.02; 362/800; 362/249.04

(58) Field of Classification Search ............. 362/249.02, 362/249.04, 311.02, 545, 800
See application file for complete search history.

(56) References Cited

U.S. PATENT DOCUMENTS

| | | | | |
|---|---|---|---|---|
| 5,325,271 A * | 6/1994 | Hutchisson | ................... | 362/555 |
| 6,976,775 B2 * | 12/2005 | Koike | ............... | 362/545 |
| 7,285,903 B2 * | 10/2007 | Cull et al. | ....................... | 313/500 |
| 7,465,064 B2 * | 12/2008 | Breinich et al. | .............. | 362/231 |
| 2004/0208018 A1 * | 10/2004 | Sayers et al. | ................... | 362/544 |
| 2005/0280683 A1 * | 12/2005 | Custer | ............................ | 347/102 |
| 2006/0256557 A1 * | 11/2006 | Kanamori et al. | ............ | 362/249 |

FOREIGN PATENT DOCUMENTS

| | | |
|---|---|---|
| DE | 101 10 835 A1 | 9/2002 |
| DE | 10 2005 007 501 U1 | 9/2005 |
| DE | 10 2006 017 718 A1 | 5/2007 |

* cited by examiner

*Primary Examiner* — Laura Tso

(57) ABSTRACT

A luminous module is specified comprising luminous units and a carrier body, wherein the luminous units are connected and/or contact-connected in at least two planes and/or orientations on the carrier body with conductor tracks. A method for producing the luminous module is furthermore specified.

22 Claims, 4 Drawing Sheets

LUMINOUS MODULE AND METHOD FOR PRODUCING IT

The invention relates to a luminous module and a method for producing it, and to a luminous system and a headlight.

Light emitting diodes (LEDs) are currently arranged principally in one plane on a circuit board. Furthermore, light emitting diodes when used in luminous applications can be connected by means of a cable section.

What is disadvantageous in this case is, in particular, that the connection of the light emitting diodes by means of cable sections is complicated and expensive.

The object of the invention is to avoid the disadvantages mentioned above and, in particular, to specify a possibility for efficiently connecting light emitting diodes on or to complex carrier bodies.

This object is achieved in accordance with the features of the independent patent claims. Embodiments of the invention also emerge from the dependent claims.

In order to achieve the object a luminous module is specified comprising luminous units and a carrier body, wherein the luminous units are connected and/or contact-connected in at least two planes and/or orientations on the carrier body with conductor tracks.

Such a connection and/or contact-connection can comprise a plug connection and/or a soldering connection.

The conductor tracks can serve, in particular, for the connection of the luminous units. Connections of the luminous units can advantageously be connected by means of the conductor tracks to a plug fitted by way of example at or on the luminous module. Consequently, the luminous units of the luminous module can be connected to a control unit by means of the plug.

In this case, it is advantageous that the light emitting diodes can be used in a flexible fashion in non-planar configurations. This is advantageous in particular in conjunction with luminous applications, e.g. luminaires or headlights, in which a projection and/or reflection optical system is provided in combination with the luminous unit. Precisely for such luminous applications, the luminous units can be positioned flexibly in a plurality of planes and/or orientations on the basis of the approach presented here.

One embodiment is that each luminous unit comprises at least one LED.

Moreover, one embodiment is that the carrier body is at least partly embodied as a heat sink. In particular, the carrier body can comprise a heat sink.

According to another embodiment, the carrier body is at least partly encapsulated with plastic by injection molding. The conductor tracks can advantageously be structured on the plastic. One possibility is for the conductor tracks to be applied electrolytically on the plastic. In particular, a laser irradiation of the surfaces can be effected beforehand, such that the conductor tracks can be applied.

An additional embodiment is that the carrier body is at least partly encapsulated with two different plastics by injection molding, wherein one of the two plastics is configured in such a way that the conductor tracks can be applied on it.

Moreover, one embodiment is that at least one part of the surface of the carrier body is activated by a plasma and/or by a laser irradiation, wherein the conductor tracks can be applied in the activated region.

Another embodiment is that the conductor tracks are arranged in and/or on a flexible material, wherein the flexible material is at least partly arranged on the carrier body.

In accordance with one embodiment, the luminous units (or at least a portion of the luminous units) are arranged on the flexible material.

The flexible material can advantageously be a flexible film.

Another embodiment is that the luminous units are arranged directly on the carrier body.

In this case, the luminous units can be adhesively bonded, for example, onto the carrier body. An effective heat transfer to the carrier body, in particular to the heat sink, is thus advantageously ensured.

Furthermore, it is possible for the luminous units to be connected to the conductor tracks by means of cables (so-called wire bonds). In this case, the luminous units can preferably be connected to the flexible film by means of such cables.

According to another embodiment, the conductor tracks are arranged on a circuit board of at least two partial regions, wherein the at least two partial regions are connected by means of at least one flexible region.

It should be noted in this case that this presentation also encompasses an arrangement of a plurality of circuit boards which are connected to one another by means of at least one flexible region.

In accordance with one embodiment, the luminous units are arranged on different locations of the circuit board. In particular, the luminous units can also be arranged on different sides of the circuit board.

In accordance with another embodiment, the conductor tracks on different sides of the flexible regions are connected by means of vias (connected by through-plating).

One embodiment is that the circuit board is a metal-core circuit board.

Moreover, one embodiment is that the at least one flexible region comprises/is a flexible film.

Furthermore, one embodiment is that the flexible film has a soldered joint with the circuit board, in particular with the metal-core circuit board. By way of example, the cable arranged in the flexible film can be soldered on the metal-core circuit board.

Another embodiment is that the carrier body has at least one cut-out for the at least one flexible region.

In this way, the flexible region can advantageously be at least partly incorporated into the carrier body and thus be correspondingly protected.

The luminous module described is suitable for example for use in a luminaire or in a headlight, in particular as a luminous module of a motor vehicle headlight.

The object as described above is also achieved by means of a luminous system comprising at least one luminous module as described herein.

Furthermore, the object is achieved by means of a headlight comprising at least one luminous module as described here.

Moreover, the above object is achieved by means of a method for producing a luminous module comprising the following steps:
  a carrier body is at least partly encapsulated with a first plastic by injection molding;
  a region of the carrier body encapsulated by injection molding is at least partly activated;
  conductor tracks for the contact-connection of luminous units are applied electrolytically on the region.

In one embodiment the carrier body is encapsulated with two different plastics by injection molding, wherein one of the two plastics is at least partly activatable.

A further embodiment is that the region is activated by means of laser irradiation and/or by means of a plasma.

Exemplary embodiments of the invention are illustrated and explained below with reference to the drawings.

Figure 1:
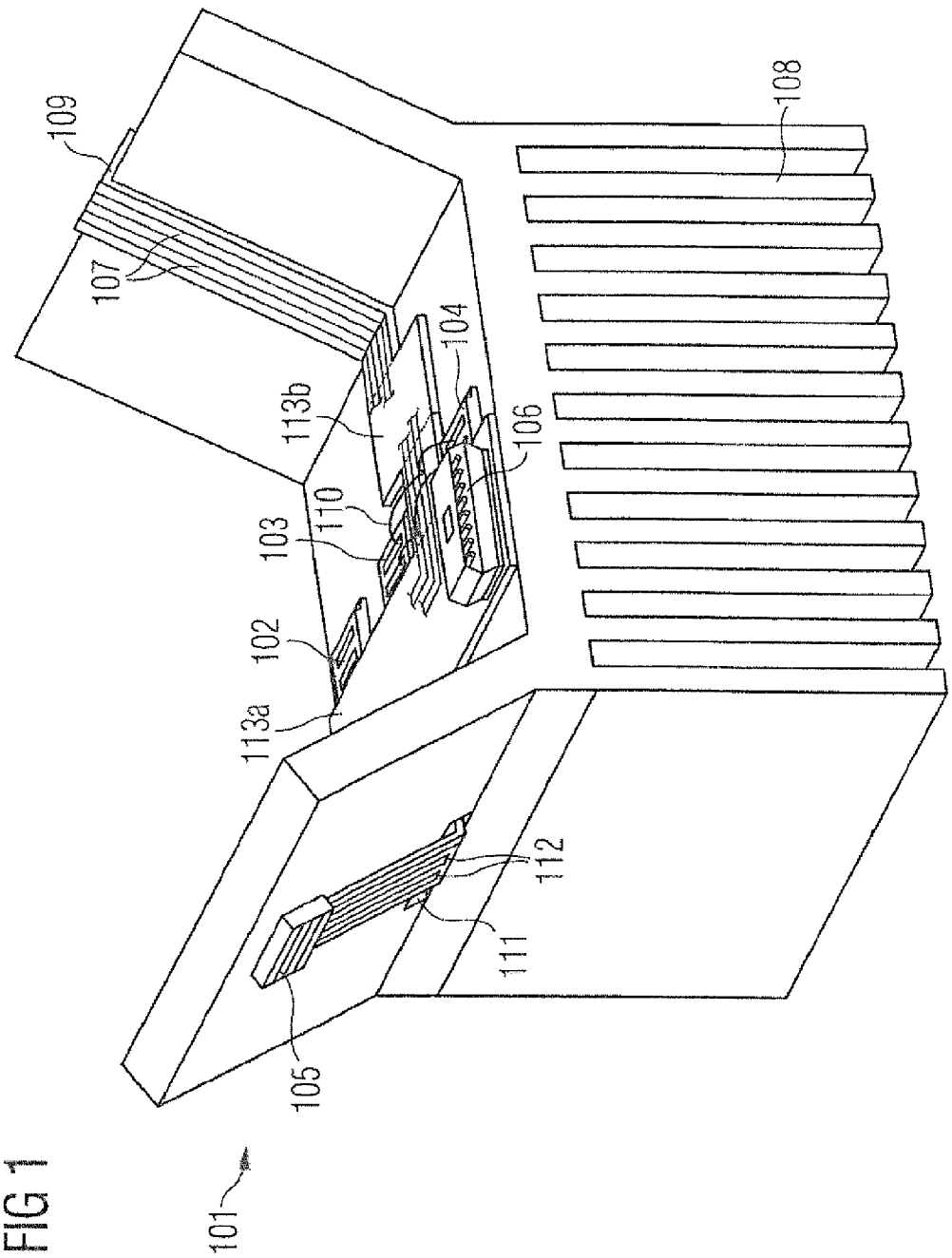
FIG. 1 shows a luminous module comprising light emitting diodes and conductor tracks, wherein the light emitting diodes are arranged in different planes.

FIG. 1 shows a luminous module 101 comprising light emitting diodes 102 to 105, a plug 106, conductor tracks 107 and a heat sink 108.

The light emitting diodes 102 to 105 are fitted on different planes of the complex heat sink 108 or on plastic encapsulation 109 thereon with partly different orientations. In this respect, individual stipulations of a reflection and/or projection optical system can be taken into account through the positioning of the light emitting diodes 102 to 105. This is advantageous when the luminous module 101 is used in a luminaire or in a headlight.

The conductor tracks 107 make contact with the light emitting diodes 102 to 105 via wire bonds 110 and connect them to the plug 106. The individual light emitting diodes 102 to 105 are (de)activated by means of a control unit (not shown), wherein the control unit is connected to the plug 106.

The conductor tracks 107 can in this case be embodied as:
- a plastic 109 on which the conductor tracks are applied electrolytically;
- a flexible film 109 on or in which the conductor tracks are arranged;
- a metal-core circuit board 113a and 113b, which can be embodied in a plurality of parts, wherein flexible regions are provided in particular at or in the region of the edges, on the basis of which regions the plurality of parts of the metal-core circuit board are connected. The flexible regions 109 can advantageously be realized as flexible films 109. Moreover, in particular the flexible regions can be at least partly integrated or incorporated into the heat sink.

The complex carrier body for the LEDs, here the heat sink 108, is partly encapsulated with a plastic by injection molding. Conductor tracks can be structured on the plastic 109 by means of various methods. In particular there is a possibility of preparing the surface by means of laser irradiation in such a way that the conductor tracks can be applied electrolytically. As an alternative, the carrier body can also be encapsulated with two different plastics 109a and 109b shown in FIG. 2 by injection molding, of which plastics one permits the electrolytic application of the conductor tracks, and the other does not. Furthermore, it is possible to activate the surfaces by means of a plasma in such a way that the conductor tracks can be applied only in the activated region.

As an alternative, it is possible to use a metal-core circuit board comprising a plurality of individual parts, wherein the individual parts of the metal-core circuit board are connected to one another by means of flexible regions (e.g. by means of a flexible film). In particular, the LEDs can be applied on the individual metal-core circuit boards for example on different sides of the metal-core circuit boards. The conductor tracks on the two sides of the flexible regions can then be connected by means of vias 112 and through cut-out 111. The metal-core circuit boards are preferably arranged on the heat sink, wherein cutouts or slots for the flexible regions can be provided in the heat sink.

For simplified mounting of the metal-core circuit boards, that is to say for mounting in (only) one plane, the components can be rotated relative to one another in the flexible region.

As an alternative, it is also possible to dispense with the metal-core circuit board, and only to apply a flexible material, e.g. a flexible film, to the heat sink 108. The LEDs or LED submounts can advantageously already be premounted on the flexible material.

Figure 2:
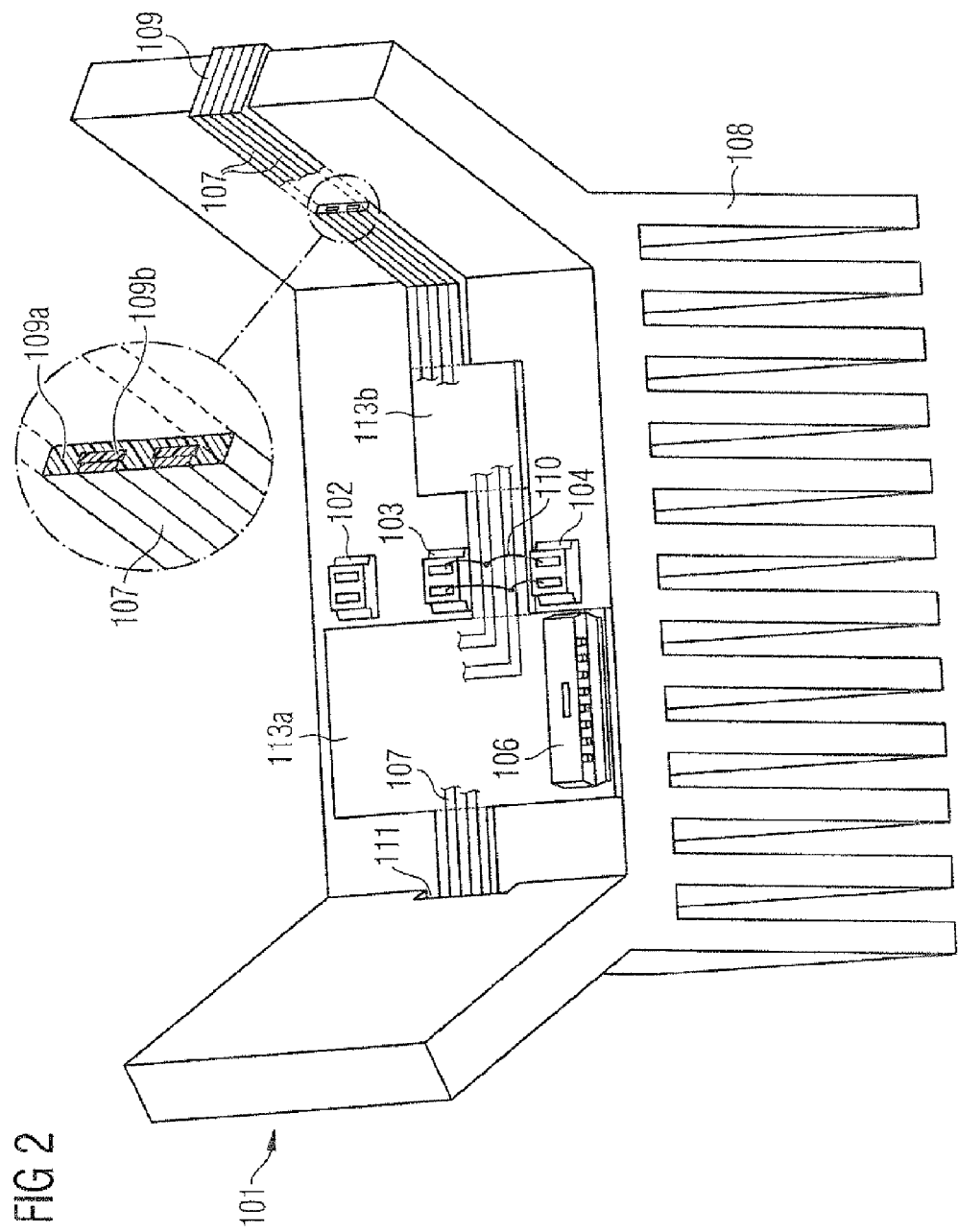
FIG. 2 and FIG. 3 show different views of the luminous module in accordance with FIG. 1.
Figure 3:
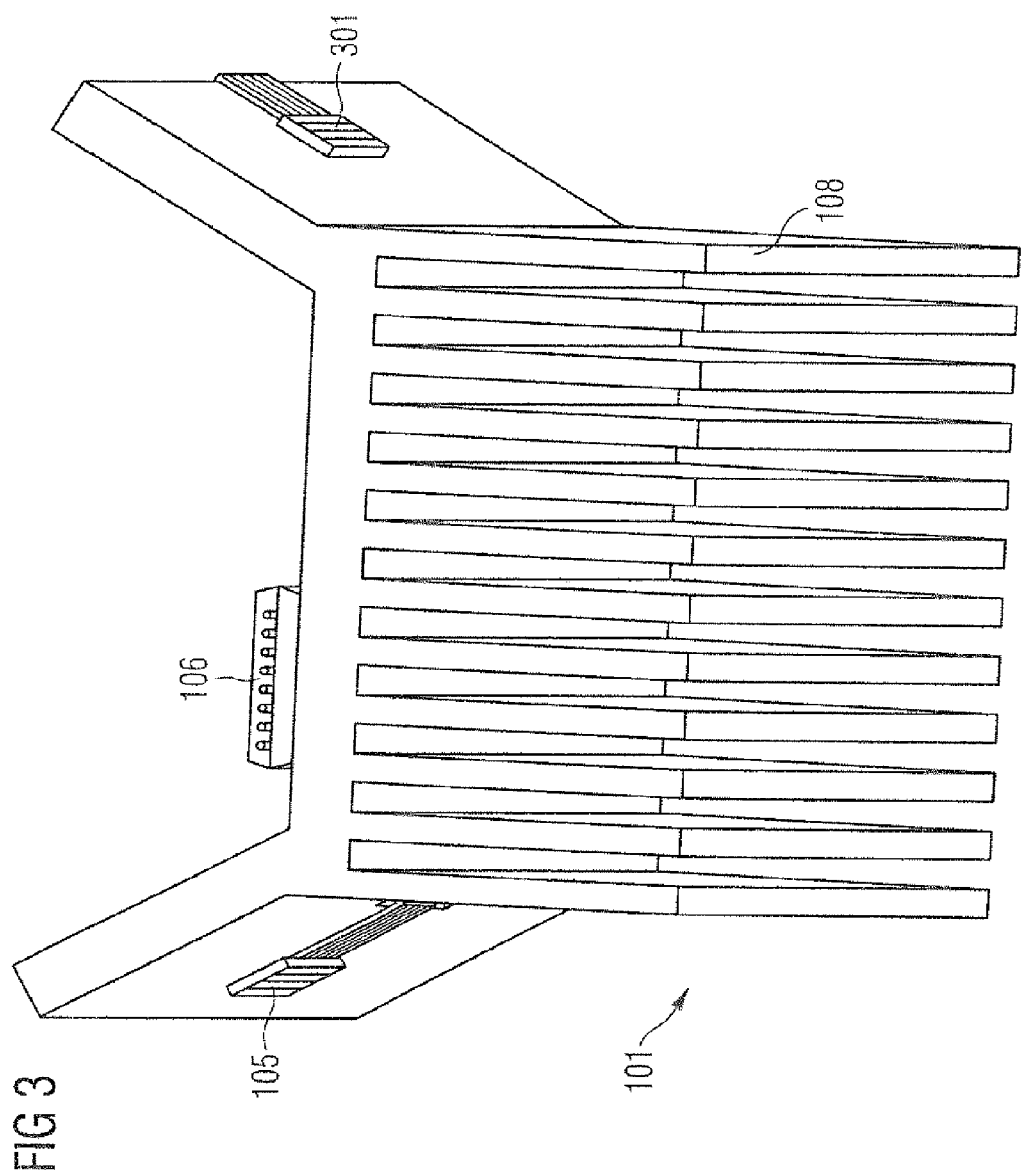

FIG. 2 and FIG. 3 show different views of the luminous module 101 in accordance with FIG. 1. FIG. 2 illustrates in a plan view the region of the conductor tracks 107, which are not just arranged in one plane, but rather in different planes. The ends in the conductor tracks can preferably be realized in accordance with one of the solution approaches presented here (e.g. flexible region, flexible film, electroplating). A light emitting diode 301 is additionally illustrated in FIG. 3.

Figure 4:
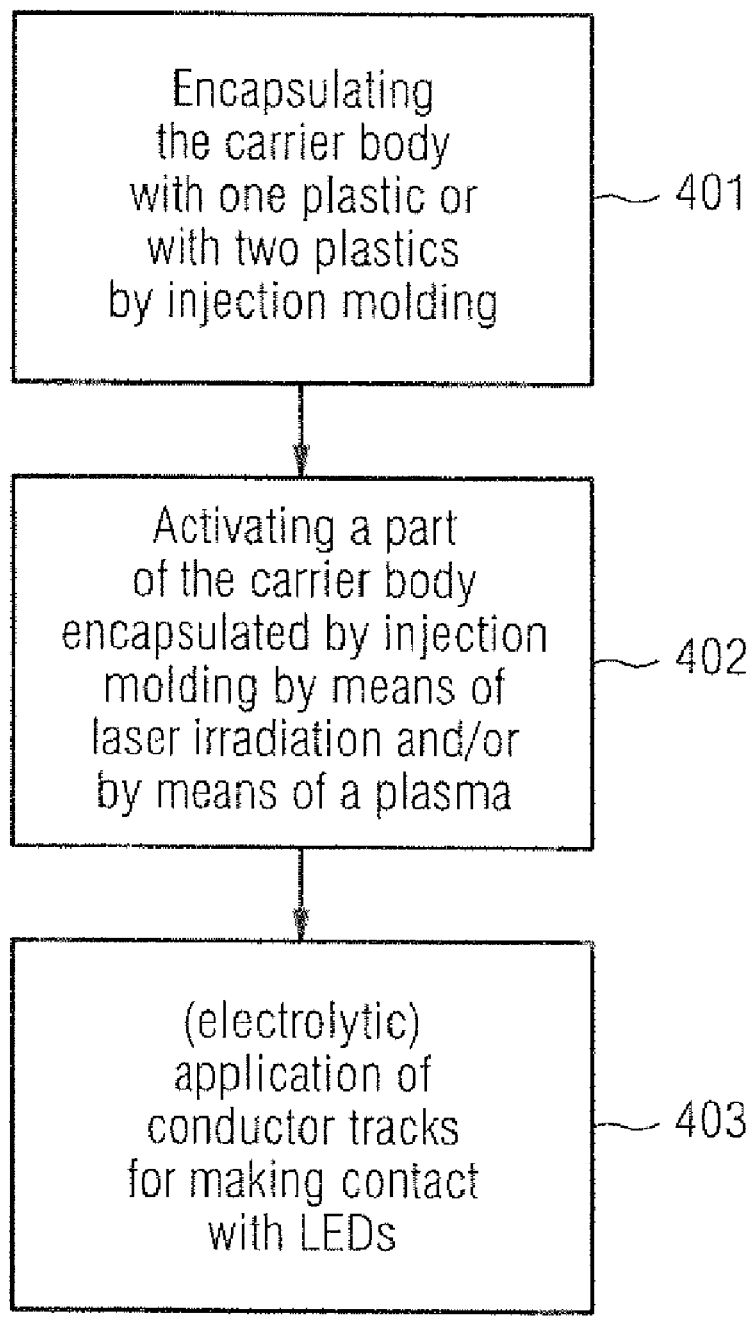
FIG. 4 shows steps of a method for producing a luminous module.

FIG. 4 shows steps of a method for producing a luminous module.

In a step 401, a carrier body (e.g. a heat sink) is at least partially encapsulated with at least one plastic by injection molding. In particular, it is possible to use two plastics, of which one plastic permits the electrolytic application of the conductor tracks, and the other does not.

In a step 402, a part of the carrier body encapsulated by injection molding is activated by means of laser irradiation and/or by means of a plasma.

In a step 403, the conductor tracks for making contact with the luminous units, in particular the LEDs or LED submounts, are applied electrolytically.

FURTHER ADVANTAGES

The approach presented here permits a significant saving of costs and a significantly reduced susceptibility to faults owing to a reduced number of necessary components and owing to the fact that a plug connection to the light emitting diodes is no longer necessary.

Furthermore, the mounting of the luminous module is significantly simplified.

A further advantage is the better thermal linking of the LEDs to the carrier body, which is preferably configured as a heat sink.

The invention claimed is:

1. A luminous module comprising luminous units and a carrier body, wherein the luminous units are connected in at least two planes or orientations on the carrier body with conductor tracks and further wherein the carrier body is at least partly encapsulated with plastic by injection molding wherein the conductor tracks are structured on the plastic.

2. The luminous module as claimed in claim 1, wherein each luminous unit comprises at least one LED.

3. The luminous module as claimed in claim 1, wherein the carrier body is a heat sink or comprises a heat sink.

4. The luminous module as claimed in claim 1, wherein the conductor tracks are applied electrolytically on the plastic.

5. The luminous module as claimed in claim 1, wherein the carrier body is at least partly encapsulated with two different plastics by injection molding, wherein one of the two plastics is configured in such a way that the conductor tracks can be applied electrolytically on it.

6. The luminous module as claimed in claim 1, wherein at least one part of the surface of the carrier body is activated by at least a plasma or a laser irradiation, wherein the conductor tracks can be applied in the activated region.

7. The luminous module as claimed in claim 1, wherein the conductor tracks are arranged at least in or on a flexible material, wherein the flexible material is at least partly fitted on the carrier body.

8. The luminous module as claimed in claim 7, wherein the luminous units are arranged on the flexible material.

9. The luminous module as claimed in claim 1, wherein the luminous units are arranged directly on the carrier body.

10. The luminous module as claimed in claim 9, wherein the luminous units are connected to the conductor tracks by means of wire bonds.

11. The luminous module as claimed in claim 1, wherein the conductor tracks are arranged on a circuit board with at least two partial regions, wherein the at least two partial regions are connected by means of at least one flexible region.

12. The luminous module as claimed in claim 11, wherein the luminous units are arranged at different locations on different sides of the circuit board.

13. The luminous module as claimed in claim 12, wherein conductor tracks on different sides of the flexible regions are connected by means of vias.

14. The luminous module as claimed in claim 11, wherein the circuit board is a metal-core circuit board.

15. The luminous module as claimed in claim 11, wherein the at least one flexible region comprises a flexible film.

16. The luminous module as claimed in claim 15, wherein the flexible film has a soldered joint with the circuit board.

17. The luminous module as claimed in claim 11, wherein the carrier body has at least one cutout for the at least one flexible region.

18. The luminous module as claimed in claim 1 for use as a luminous module in a luminaire and in a headlight.

19. The luminous system comprising at least one luminous module as claimed in claim 1.

20. A method for producing a luminous module comprising the following steps: a carrier body is at least partly encapsulated with a first plastic by injection molding; a region of the carrier body encapsulated by injection molding is at least partly activated; conductor tracks for the connection of luminous units are applied electrolytically on the region.

21. The method as claimed in claim 20, wherein the carrier body is encapsulated with two different plastics by injection molding, wherein one of the two plastics is at least partly activatable.

22. The method as claimed in claim 20, wherein the region is activated at least by means of laser irradiation or by means of a plasma.

* * * * *